(12) United States Patent
Ranganathan et al.

(10) Patent No.: US 12,235,314 B2
(45) Date of Patent: Feb. 25, 2025

(54) PARALLEL TEST CELL WITH SELF ACTUATED SOCKETS

(71) Applicant: Advantest Test Solutions, Inc., San Jose, CA (US)

(72) Inventors: Karthik Ranganathan, Foothill Ranch, CA (US); Gilberto Oseguera, Corona, CA (US); Gregory Cruzan, Anaheim, CA (US); Joe Koeth, San Jose, CA (US); Ikeda Hiroki, Kukishi Saitama (JP); Kiyokawa Toshiyuki, Kukishi Saitama (JP)

(73) Assignee: Advantest Test Solutions, Inc, San Jose, CA (US)

( * ) Notice: Subject to any disclaimer, the term of this patent is extended or adjusted under 35 U.S.C. 154(b) by 173 days.

(21) Appl. No.: 17/877,660

(22) Filed: Jul. 29, 2022

(65) Prior Publication Data

US 2023/0083634 A1    Mar. 16, 2023

Related U.S. Application Data

(60) Provisional application No. 63/244,145, filed on Sep. 14, 2021.

(51) Int. Cl.
  *G01R 1/02*    (2006.01)
  *G01R 1/04*    (2006.01)
  (Continued)

(52) U.S. Cl.
  CPC ....... *G01R 31/2834* (2013.01); *G01R 1/0441* (2013.01)

(58) Field of Classification Search
  CPC . G01R 1/02; G01R 1/04; G01R 1/067; G01R 1/073; G01R 31/04; G01R 31/28; G01R 31/317; G01R 31/319
  See application file for complete search history.

(56) References Cited

U.S. PATENT DOCUMENTS

| | | |
|---|---|---|
| 5,126,656 A | 6/1992 | Jones |
| 5,164,661 A | 11/1992 | Jones |

(Continued)

FOREIGN PATENT DOCUMENTS

| | | |
|---|---|---|
| CN | 101073016 A | 11/2007 |
| CN | 103038751 A | 4/2013 |

(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Neel D Shah

(57) ABSTRACT

An automated test equipment (ATE) includes a test interface board assembly. The test interface board includes a socket configured to provide electrical couplings from the test interface board to a device under test (DUT). The socket is further configured to accept an active thermal interposer (ATI) device while the DUT is disposed in the socket. The socket includes a plurality of spring-loaded roller retention devices configured to retain one or more devices in the socket. The ATE further includes a Z-axis interface plate configured to open the plurality of spring-loaded roller retention devices to enable insertion of the DUT into the socket and an ATI placement plate configured to open the plurality of spring-loaded roller retention devices to enable insertion of the ATI device into the socket.

20 Claims, 13 Drawing Sheets

(51) Int. Cl.
*G01R 1/067* (2006.01)
*G01R 1/073* (2006.01)
*G01R 31/28* (2006.01)

(56) References Cited

U.S. PATENT DOCUMENTS

| | | |
|---|---|---|
| 5,239,093 A | 8/1993 | Cheng |
| 5,315,240 A | 5/1994 | Jones |
| 5,329,093 A | 7/1994 | Okano |
| 5,420,521 A | 5/1995 | Jones |
| 5,738,531 A | 4/1998 | Beaman et al. |
| 5,821,505 A | 10/1998 | Tustaniwskyj et al. |
| 6,184,504 B1 | 2/2001 | Cardella |
| 6,359,264 B1 | 3/2002 | Schaper et al. |
| 6,389,225 B1 | 5/2002 | Malinoski et al. |
| 6,452,113 B2 | 9/2002 | Dibene, II et al. |
| 6,498,899 B2 | 12/2002 | Malinoski et al. |
| 6,668,570 B2 | 12/2003 | Wall et al. |
| 6,711,904 B1 | 3/2004 | Law et al. |
| 6,825,681 B2 | 11/2004 | Feder et al. |
| 6,862,405 B2 | 3/2005 | Malinoski et al. |
| 6,985,000 B2 | 1/2006 | Feder et al. |
| 7,042,240 B2 * | 5/2006 | Lopez ............. G01R 31/2863 374/E1.021 |
| 7,126,217 B2 | 10/2006 | Chiu et al. |
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,659,738 B2 | 2/2010 | Hong |
| 7,726,145 B2 | 6/2010 | Nakamura |
| 7,755,899 B2 | 7/2010 | Stenmark |
| 7,830,164 B2 | 11/2010 | Earle et al. |
| 7,848,106 B2 | 12/2010 | Merrow |
| 8,343,280 B2 | 1/2013 | Iimuro |
| 8,558,540 B2 | 10/2013 | Wu et al. |
| 8,772,682 B2 | 7/2014 | Ambal et al. |
| 8,927,907 B2 | 1/2015 | Fink et al. |
| 9,080,820 B2 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,414,526 B2 | 8/2016 | Mann et al. |
| 9,494,353 B2 | 11/2016 | Yu et al. |
| 9,766,287 B2 | 9/2017 | Naraski et al. |
| 9,841,772 B2 | 12/2017 | Bucher |
| 10,056,225 B2 | 8/2018 | Gaff et al. |
| 10,163,668 B2 | 12/2018 | Steinhauser |
| 10,354,785 B2 | 7/2019 | Yamaguchi et al. |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,143,697 B2 | 10/2021 | Wolff |
| 11,493,551 B2 | 11/2022 | Ranganathan et al. |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2006/0290370 A1 | 12/2006 | Lopez |
| 2009/0218087 A1 | 9/2009 | Oshima |
| 2010/0042355 A1 | 2/2010 | Aube et al. |
| 2011/0050268 A1 | 3/2011 | Co et al. |
| 2011/0074080 A1 | 3/2011 | Di Stefano et al. |
| 2013/0181576 A1 | 7/2013 | Shiozawa et al. |
| 2013/0285686 A1 | 10/2013 | Malik et al. |
| 2014/0251214 A1 | 9/2014 | Cuvalci et al. |
| 2015/0028912 A1 | 1/2015 | Cho et al. |
| 2015/0168450 A1 | 6/2015 | Wooden et al. |
| 2015/0226794 A1 | 8/2015 | Chen |
| 2015/0241478 A1 | 8/2015 | Davis et al. |
| 2016/0084880 A1 | 3/2016 | LoCicero et al. |
| 2016/0351526 A1 | 12/2016 | Boyd et al. |
| 2017/0102409 A1 | 4/2017 | Sarhad et al. |
| 2018/0024188 A1 | 1/2018 | Cruzan et al. |
| 2018/0189159 A1 | 7/2018 | Carmichael et al. |
| 2018/0218926 A1 | 8/2018 | Stuckey et al. |
| 2019/0064254 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0363104 A1 * | 11/2020 | MacDonald ............. G06F 1/20 |
| 2020/0371155 A1 | 11/2020 | Walczyk et al. |
| 2021/0071917 A1 | 3/2021 | Pei et al. |
| 2021/0148970 A1 | 5/2021 | Miyaaki |
| 2021/0156906 A1 * | 5/2021 | Furukawa .......... G01R 31/2891 |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0137092 A1 | 5/2022 | Ranganathan et al. |
| 2022/0137129 A1 | 5/2022 | Ranganathan et al. |

FOREIGN PATENT DOCUMENTS

| | | |
|---|---|---|
| CN | 110618903 A | 12/2019 |
| EP | 3270261 A1 | 1/2018 |
| IN | 105144114 A | 12/2015 |
| JP | 2005156172 A | 6/2005 |
| JP | 2008275512 A | 11/2008 |
| KR | 10-2017-0125489 A | 11/2017 |
| TW | 200428564 A | 12/2004 |
| TW | 200535440 A | 11/2005 |
| TW | 201323883 A | 6/2013 |
| TW | 201504647 A | 2/2015 |
| TW | 201543638 A | 11/2015 |
| TW | 201608254 A | 3/2016 |
| TW | 201636618 A | 10/2016 |
| TW | 201840996 A | 11/2018 |
| TW | 202042609 | 4/2019 |
| TW | 202043787 A | 12/2020 |
| WO | 2016122039 A1 | 8/2016 |
| WO | 2017015052 A1 | 1/2017 |
| WO | 2017039936 A1 | 3/2017 |
| WO | 2017112076 A1 | 6/2017 |
| WO | 2020159954 A1 | 8/2020 |

\* cited by examiner

PARALLEL TEST CELL WITH SELF ACTUATED SOCKETS

RELATED APPLICATION(S)

This Application claims benefit of, and priority to U.S. Provisional Application Ser. No. 63/244,145, filed Sep. 14, 2021 to Ranganathan et al., entitled "Parallel Test Cell with Self Actuated Sockets," which is incorporated herein by reference in its entirety. This Application is related to U.S. patent application Ser. No. 17/531,649, filed Nov. 19, 2021, to Kabbani et al., entitled "Testing System Including Active Thermal Interposer Device," which is incorporated herein by reference in its entirety. This Application is also related to U.S. patent application Ser. No. 16/986,037, filed Aug. 5, 2020, to Ranganathan et al., entitled "Integrated Test Cell Using Active Thermal Interposer (ATI) with Parallel Socket Actuation," which is incorporated herein by reference in its entirety.

FIELD OF INVENTION

Embodiments of the present invention relate to the field of electronic manufacturing and test. More specifically, embodiments of the present invention relate to systems and methods involving test cells with sockets.

BACKGROUND

Automated test equipment (ATE) generally includes any testing assembly that performs a test on a semiconductor wafer or die, an integrated circuit (IC), a multi-chip module, a circuit board, or a packaged device such as a solid-state drive. ATE assemblies may be used to execute automated tests that quickly perform measurements and generate test results that can then be analyzed by an ATE system. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and also serve as a diagnostic tool to determine the presence of faulty components within a given device before it reaches the consumer. ATE systems can also be used to test and record device performance for pass/fail determination and for device binning determinations.

It is common to subject electronic devices, for example, integrated circuits and/or multi-chip modules, either packaged or unpackaged, to environmental testing as an operation in a manufacturing processes. Typically in such testing, the integrated circuit devices are subject to electrical testing, e.g., "test patterns," or vectors in an automated test equipment (ATE) to confirm functionality while being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber. The environmental chamber heats and/or cools the integrated circuit(s) under test, known as or referred to as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. In addition, due to the large volumes of air and mass of mounting structures and interface devices required within an environmental test chamber, the environment inside such a test chamber may not be changed rapidly, limiting a rate of testing. Further, placing and removing DUTs and testing apparatus into and out of such test chambers further limits rates of testing, and requires complex and expensive mechanisms to perform such insertions and removals.

As disclosed in U.S. patent application Ser. No. 17/531,649, incorporated herein by reference in its entirety, an Active Thermal Interposer (ATI) device may reduce and/or eliminate a need for environmental chambers during device testing. It is desirable to couple such Active Thermal Interposer devices to devices under test (DUT) in an efficient manner that supports a beneficially high testing throughput.

SUMMARY OF THE INVENTION

Therefore, what is needed are systems and methods for parallel test cells with self actuated sockets. In addition, systems and methods for parallel test cells with self actuated sockets that open and close socket retention mechanisms in parallel are needed. Further, systems and methods for parallel test cells with self actuated sockets that place active thermal interposer devices in parallel are need. Still further, systems and methods for parallel test cells with self actuated sockets that are compatible and complementary with existing systems and method of electronic device testing are needed.

In accordance with an embodiment of the present invention, an automated test equipment (ATE) for testing devices under test (DUTs) includes a test interface board assembly. The test interface board assembly includes a socket configured to provide electrical couplings from the test interface board assembly to a device under test (DUT). The socket is further configured to accept an active thermal interposer (ATI) device while the DUT is contemporaneously disposed in the socket. The socket includes a plurality of spring-loaded roller retention devices configured to retain one or more devices in the socket. The ATE further includes a Z-axis interface plate configured to open the plurality of spring-loaded roller retention devices to enable insertion of the DUT into the socket and an ATI placement plate configured to open the plurality of spring-loaded roller retention devices to enable insertion of the ATI device into the socket.

Embodiments of the present invention include the above and further include wherein the ATI placement plate is further configured to place the ATI device above the socket.

Embodiments of the present invention include the above and further include wherein the ATI placement plate is further configured to place a plurality of ATI devices above a corresponding plurality of the sockets.

Embodiments of the present invention include the above and further include wherein the Z-axis interface plate includes a plurality of roller activation features configured to open the plurality of spring-loaded roller retention devices.

Embodiments of the present invention include the above and further include wherein the Z-axis interface plate includes a plurality of holes configured to allow a pick and place head to place the DUT into the socket while the plurality of spring-loaded roller retention devices are contemporaneously held open by the Z-axis interface plate.

Embodiments of the present invention include the above and further include wherein the ATI placement plate includes a plurality of roller activation features configured to open the plurality of spring-loaded roller retention devices.

Embodiments of the present invention include the above and further include wherein the ATI placement plate is configured to allow the ATI device to be placed into the socket while the plurality of spring-loaded roller retention devices are contemporaneously held open by the ATI placement plate.

Embodiments of the present invention include the above and further include wherein the Z-axis interface plate is configured for movement along an axis perpendicular to a plane of the test interface board assembly is configured to open and close the plurality of spring-loaded roller retention devices.

Embodiments of the present invention include the above and further include wherein the ATI placement plate is configured for movement along an axis perpendicular to a plane of the test interface board assembly is configured to open and close the plurality of spring-loaded roller retention devices.

Embodiments of the present invention include the above and further include wherein the Z-axis interface plate is configured to open the plurality of spring-loaded roller retention devices of at least two sockets.

Embodiments of the present invention include the above and further include wherein the ATI placement plate is configured to open the plurality of spring-loaded roller retention devices of at least two sockets.

Embodiments of the present invention include the above and further include a plurality of pogo pins configured to provide electrical power among the test interface board assembly and the ATI independent of electrical contacts of the socket.

Embodiments of the present invention include the above and further include wherein the socket is physically and electrically coupled to a socket interface board, and wherein the socket interface board is physically and electrically coupled to a main board of the test interface board assembly.

Embodiments of the present invention include the above and further include wherein the socket includes a gap in at least one side thereof configured to enable a portion of an ATI to extend beyond a footprint of the socket.

In accordance with an embodiment of the present invention, an automated test equipment includes a test interface board assembly. The test interface board assembly includes a plurality of socket interface boards. Each socket interface board includes a socket configured to restrain a device under test (DUT). The socket is further configured to restrain a discrete active thermal interposer (ATI). The ATI includes thermal functions and is operable to make thermal contact with the DUT. The automated test equipment further includes an ATI placement plate configured to contain the ATI prior to placement in the socket. The ATI is separate from the ATI placement plate, and the ATI placement plate is further configured to provide a contact force sufficient to open retention features of the socket.

Embodiments of the present invention include the above and further include wherein the ATI placement plate is configured to open the retention features of all sockets on the plurality of socket interface boards in a single operation.

Embodiments of the present invention include the above and further include wherein the retention features of the socket include a spring-loaded roller retention device.

Embodiments of the present invention include the above and further include wherein the thermal functions of the ATI include cooling the DUT.

In accordance with a method embodiment of the present invention, a method of testing a device under test includes opening a plurality of spring-loaded roller retention devices of a socket using a Z-axis interface plate, using a pick and place head, placing a device under test (DUT) into the socket while the Z-axis interface plate contemporaneously retains the spring-loaded roller retention devices in an open state, subsequent to the placing the DUT into the socket, opening the plurality of spring-loaded roller retention devices of the socket using an active thermal interposer (ATI) placement plate, wherein the ATI placement plate retains an ATI device, placing the ATI device into the socket while the ATI placement plate contemporaneously retains the spring-loaded roller retention devices in an open state, and testing the DUT while in thermal contact with the ATI within the socket.

Embodiments of the present invention include the above and further include automatically closing the plurality of spring-loaded roller retention devices responsive to the ATI placement plate moving away from the socket.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

DETAILED DESCRIPTION

Figure 1:
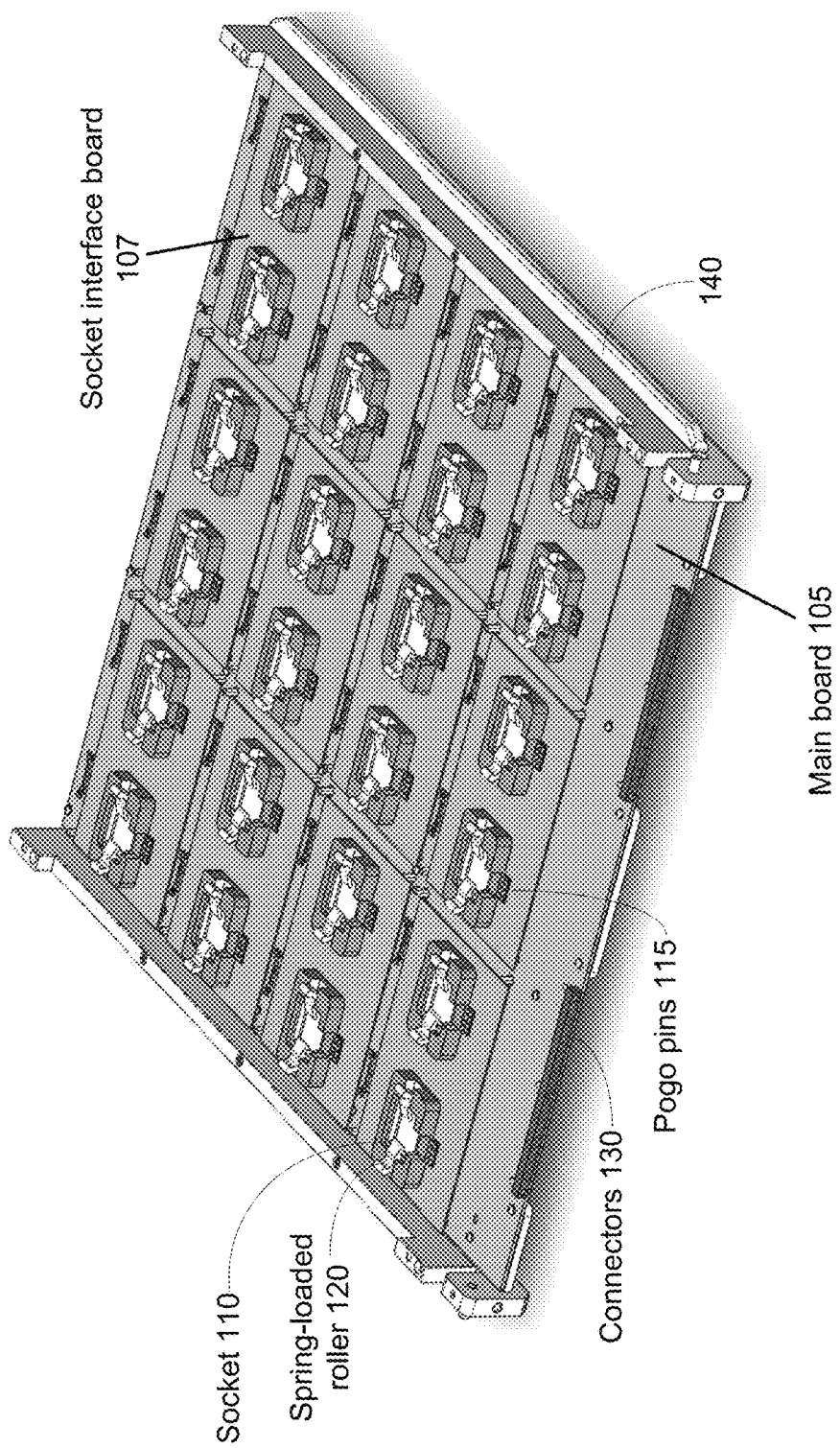
FIG. 1 illustrates an exemplary test interface board assembly, in accordance with embodiments of the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

NOTATION AND NOMENCLATURE

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, method, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computing system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "accessing," "allocating," "storing," "receiving," "sending," "writing," "reading," "transmitting," "loading," "pushing," "pulling," "processing," "caching," "routing," "determining," "selecting," "requesting," "synchronizing," "copying," "mapping," "updating," "translating," "generating," "allocating," or the like, refer to actions and processes of an apparatus or computing system or similar electronic computing device, system, or network. A computing system or similar electronic computing device manipulates and transforms data represented as physical (electronic) quantities within memories, registers or other such information storage, transmission or display devices.

Some elements or embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer storage media and communication media. Generally, program modules include routines, programs, objects, components, data structures, etc., that perform particular tasks or implement particular abstract data types. The functionality of the program modules may be combined or distributed as desired in various embodiments.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 2007). The use of this term is to be understood to remove only propagating transitory signals per se from the claim scope and does not relinquish rights to all standard computer-readable media that are not only propagating transitory signals per se.

Computer storage media includes volatile and nonvolatile, removable and non-removable media implemented in any method or technology for storage of information such as computer-readable instructions, data structures, program modules, or other data. Computer storage media includes, but is not limited to, double data rate (DDR) memory, random access memory (RAM), static RAMs (SRAMs), dynamic RAMs (DRAMs), read only memory (ROM), electrically erasable programmable ROM (EEPROM), flash memory (e.g., an SSD) or other memory technology, compact disk ROM (CD-ROM), digital versatile disks (DVDs) or other optical storage, magnetic cassettes, magnetic tape, magnetic disk storage or other magnetic storage devices, or any other medium that may be used to store the desired information and that may be accessed to retrieve that information.

Communication media may embody computer-executable instructions, data structures, and program modules, and includes any information delivery media. By way of example, and not limitation, communication media includes wired media such as a wired network or direct-wired connection, and wireless media such as acoustic, radio frequency (RF), infrared and other wireless media. Combinations of any of the above may also be included within the scope of computer-readable media.

Parallel Test Cell with Self Actuated Sockets

Embodiments in accordance with the present invention may include: a plurality of roller sockets configured to accept a device under test, a system to simultaneously place a plurality of devices under test (DUT) into the plurality of roller sockets, a system to place a plurality of active thermal interposers (ATI) onto the DUTs, and a Z-interface plate to simultaneously close the plurality of roller sockets onto the devices under test and ATIs. The roller sockets provide power and optionally control signals to the ATI.

FIG. 1 illustrates an exemplary test interface board (TIB) assembly 100 with an array of sockets, in accordance with embodiments of the present invention. Test interface board assembly 100 may also be known as or referred to as a burn-in board (BIB). Test interface board assembly 100 may comprise a main board 105, e.g., a printed wiring board, and a plurality of socket interface boards 107, in some embodiments. For example, as illustrated in FIG. 1, each socket interface board 107 comprises a raised printed wiring board comprising two sockets 110. The number of sockets per socket interface board, and the number of socket interface boards per main board as shown in FIG. 1 are exemplary. The socket interface boards 107 are mounted to and electrically coupled to main board 105. By placing the sockets 110 on socket interface boards 107, a vertical height, relative to the plane of the main board 105, of each of the sockets may be adjusted, e.g., by changing the height of spacers. Such height adjustments may be desirable, for example, to accommodate different heights of sockets, and/or different heights of stacked components, for example. The use of socket interface boards 107 may also enable reuse of a main board for different DUTs and/or different ATIs.

As discussed, test interface board assembly 100 comprises a plurality of sockets 110, e.g., on socket interface boards 107. Each socket 110 can have alignment features that allow a device under test and an active thermal interposer to be placed in the socket 110 correctly, in accordance with embodiments of the present invention. For example, the socket 110 may comprise alignment holes corresponding to alignment pins of an ATI device. Further information on, and exemplary embodiments of alignment features may be found in U.S. patent application Ser. No. 17/531,649, entitled "Testing System Including Active Thermal Interposer Device," which application is incorporated herein by reference in its entirety.

Each socket 110 comprises a plurality, e.g., two, of spring-loaded roller retention devices 120. The spring-loaded roller retention devices 120 are configured to secure and/or retain a Device Under Test (DUT) and/or an Active Thermal Interposer (ATI) to a corresponding socket during a test process. The spring-loaded roller retention devices 120 are normally closed. For example, an external "downward" force must be applied to open the spring-loaded roller retention devices 120. The spring-loaded roller retention devices 120 are configured to capture and secure a wide variety of devices, including multiple devices, comprising a wide range of heights and horizontal dimensions. For example, spring-loaded roller retention devices 120 may be configured to secure a relatively thin integrated circuit device in the socket 110. Additionally, the same spring-loaded roller retention devices 120 may be configured to secure a relatively thicker multi-chip module, e.g., including "stacked" integrated circuits and an interconnect wiring substrate in the socket 110. Further, the same spring-loaded roller retention devices 120 may be configured to secure an active thermal interposer stacked on top of one or more integrated circuit devices in the socket 110. The sockets 110 may be configured to removably couple a DUT and/or an ATI device to the test interface board assembly 100.

The test interface board assembly 100 further comprises one or more connectors 130, e.g., on main board 105, to couple test and/or power signals from the test interface board assembly 100 to a test system. In some embodiments, ribbon cables (not shown) or similar wiring may couple a test system directly to a socket, for example, in addition to couplings provided by connectors 130. Test interface board assembly 100 may comprise pogo pins and/or pogo-pin contacts 115, in some embodiments. The pogo pins and/or pogo-pin contacts 115 may provide for signals and/or power couplings for an active thermal interposer, for example. The test interface board assembly 100 may be designed to slide into a test system or other assembly guided by rails 140, in some embodiments. The rails 140 may also be used by other systems and/or devices to grasp the test interface board assembly 100, in accordance with embodiments of the present invention.

Figure 2:
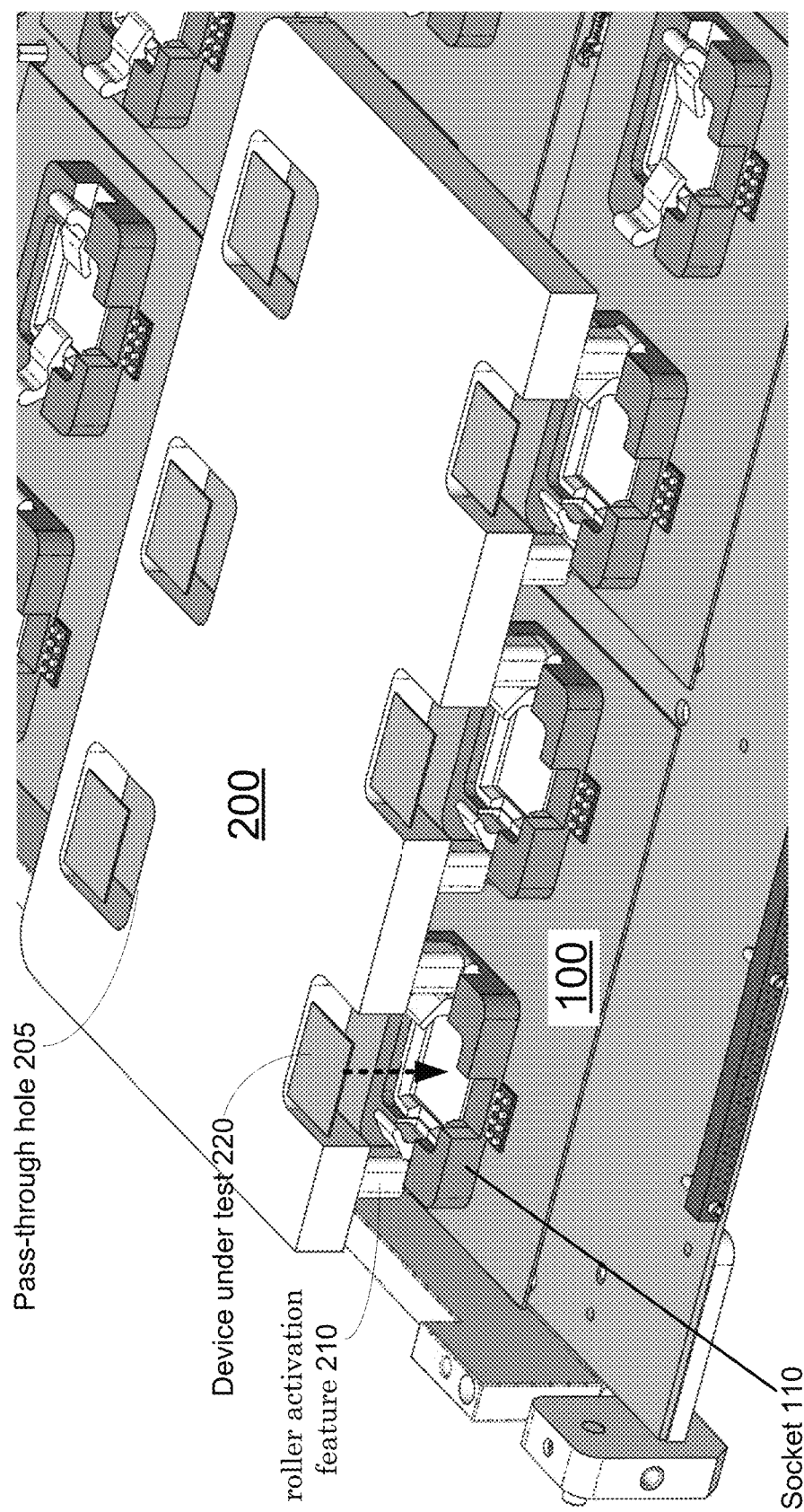
FIG. 2 illustrates an exemplary interaction of a Z-axis interface plate with a test interface board assembly, in accordance with embodiments of the present invention.

FIG. 2 illustrates an exemplary interaction of a Z-axis interface (ZIF) plate 200 with a test interface board assembly 100, in accordance with embodiments of the present invention. Z-axis interface plate 200 comprises a plurality of roller activation features 210. The roller activation features 210 are fixed to the Z-axis interface plate 200, and do not move relative to the Z-axis interface plate 200. In some embodiments, the roller activation features 210 are formed from the same material and formed at the same time during a manufacture of the Z-axis interface plate 200. For example, a same manufacturing process, for example, injection molding, additive manufacturing, e.g., "3-D printing," and/or subtractive manufacturing, e.g., machining, may be utilized to form Z-axis interface plate 200 and the roller activation features 210 in substantially the same operation. The roller activation features 210 are configured to apply a force to the spring-loaded roller retention devices 120 (FIG. 1) to open the spring-loaded roller retention devices 120 such that a Device Under Test (DUT) 220 may be placed (dashed arrow) into the socket 110 (FIG. 1).

Z-axis interface plate 200 comprises a plurality of pass-through holes 205. Pass-though holes 205 are configured to allow placement of DUTs 220 into the sockets 110 while the roller activation features 210 hold the spring-activated rollers open. After placement on the DUTs 220 into the sockets 110, the Z-axis interface plate 200 may be raised such that the roller activation features 210 no longer contact the spring-loaded roller retention devices 120. Due to the spring activation features of the spring-loaded roller retention devices 120, the spring-loaded roller retention devices 120 will close onto the DUTs 220, securing the DUTs 220 into the sockets 110.

Figure 3:
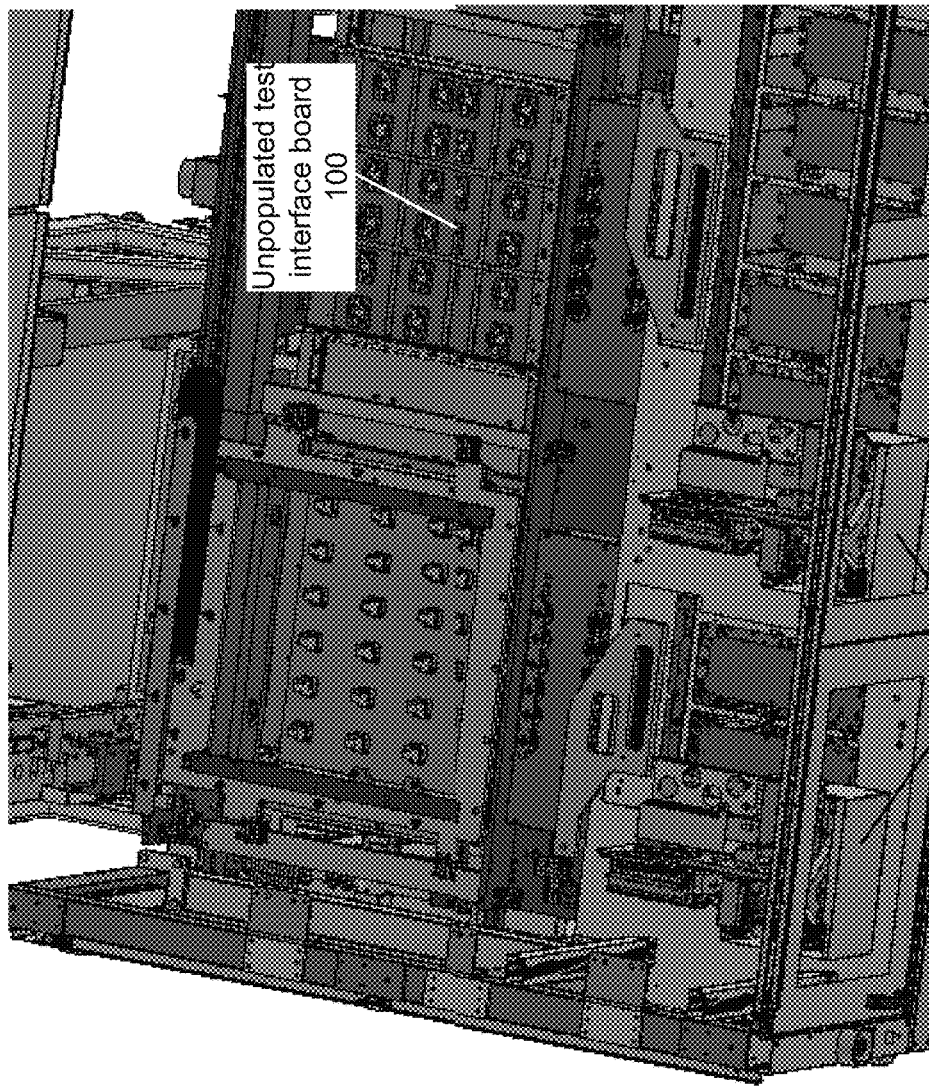
FIG. 3 illustrates an exemplary portion of a loading apparatus for loading devices under test into a test interface board assembly, in accordance with embodiments of the present invention.

FIG. 3 illustrates an exemplary portion of a loading apparatus 300 for loading devices under test 220 (FIG. 2) into a test interface board assembly 100, in accordance with embodiments of the present invention. Loading apparatus 300 comprises an unpopulated test interface board assembly 100. Loading apparatus further 300 comprises a pick and place head 310. In some embodiments, loading apparatus 300 may comprise multiple pick and place heads, for example, to speed up placement. In accordance with embodiments of the present invention, a pick and place head 310 accesses an instance of a DUT 220 from a tray and places the DUT 220 into a socket 110 through a pass through hole 205 while the roller activation features 210 of Z-axis interface plate 200 hold the spring-loaded roller retention devices 120 open.

Figure 4:
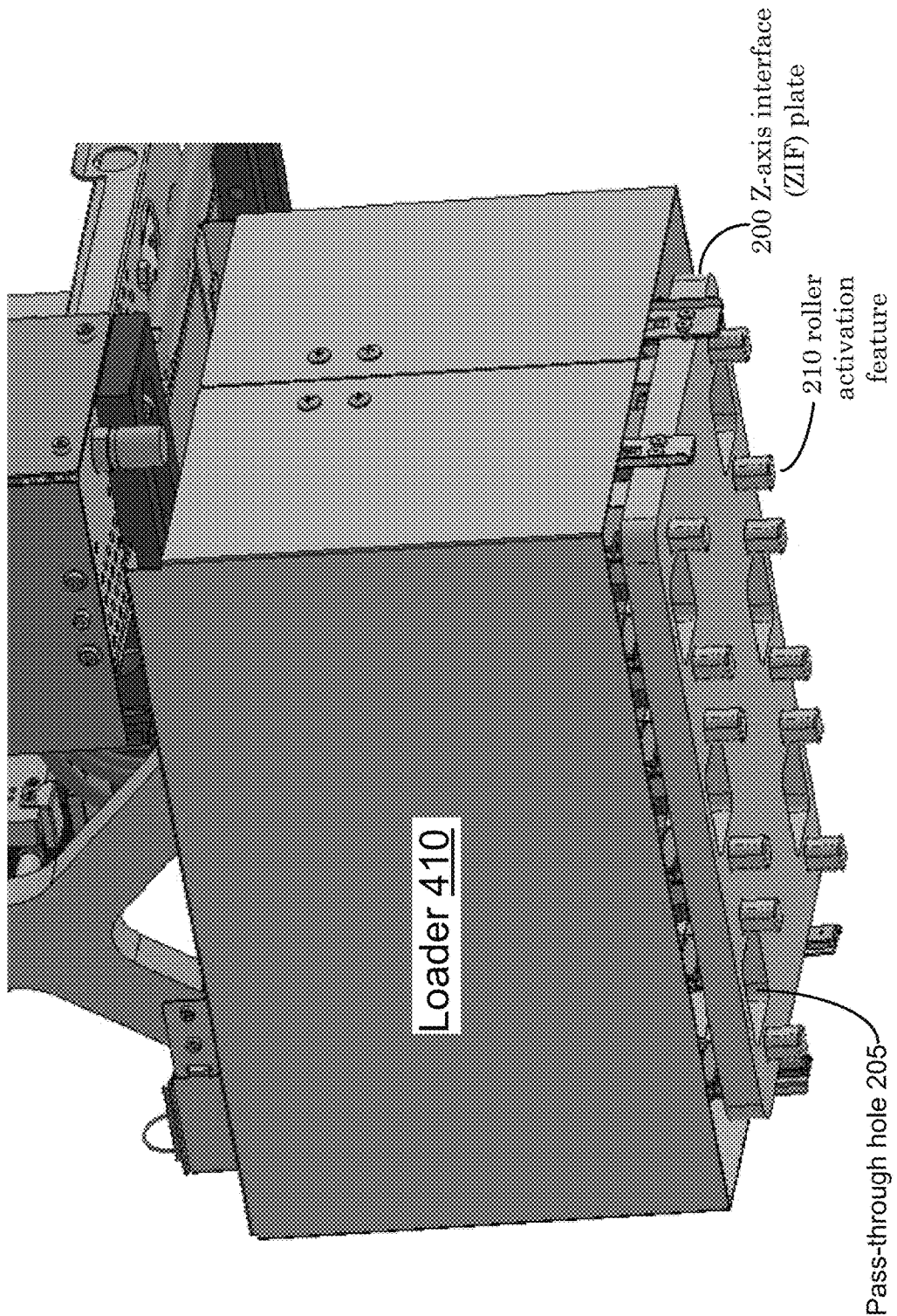
FIG. 4 illustrates an exemplary loading system for loading devices under test into a test interface board assembly, in accordance with embodiments of the present invention.

FIG. 4 illustrates an exemplary loading system 400 for loading devices under test 220 (FIG. 2) into a test interface board assembly 100, in accordance with embodiments of the present invention. Loading system 400 comprises a loader 410 and a Z-axis interface (ZIF) plate 200. Loading system 400 is configured to lower the Z-axis interface plate 200 onto the test interface board assembly 100 in order to open the spring-loaded roller retention devices 120 (FIG. 1) and allow the devices under test 220 (FIG. 2) to be placed into the sockets 110 of the test interface board assembly 100, for example through pass-through holes 205, by the loader 410. Advantageously, loading system 400 may populate multiple, including all, instances of sockets 110 on test interface board assembly 100 with DUTs 220 in parallel, e.g., via a single operation, in some embodiments.

Figure 5:
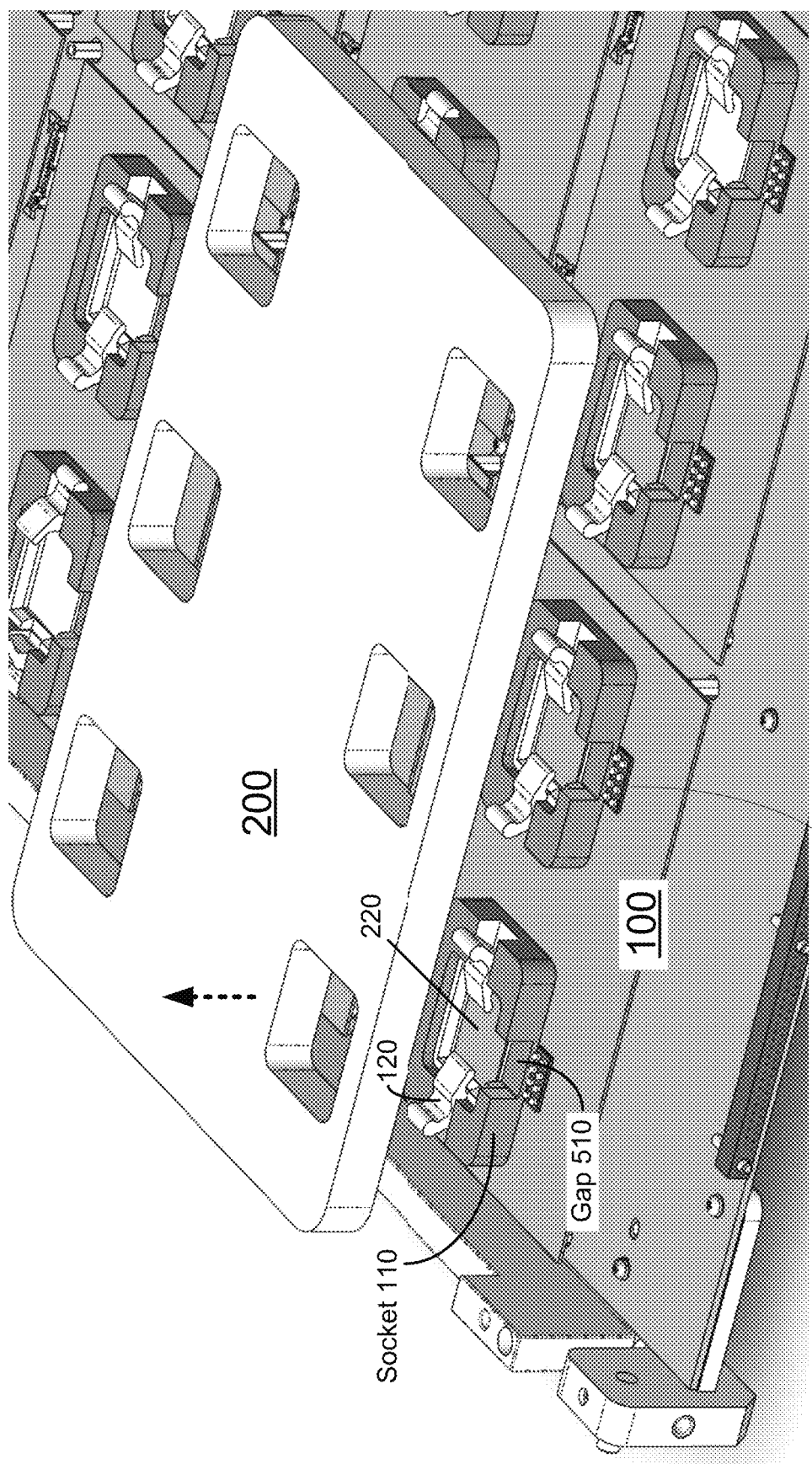
FIG. 5 illustrates an exemplary Z-axis interface plate raised above a test interface board assembly after placement of a device under test, in accordance with embodiments of the present invention.

FIG. 5 illustrates an exemplary Z-axis interface plate 200 raised above a test interface board assembly 100 after placement of a device under test 220, in accordance with embodiments of the present invention. The device under test 220 is captured in socket 110 by the spring-loaded roller retention devices 120, in a closed position. For example, the spring-loaded roller retention devices 120 automatically move to a closed position upon removal of the Z-axis interface plate 200.

As illustrated in FIG. 5, each socket 110 may comprise a gap or opening 510 in at least one wall or side of the socket 110. The gap 510 enables a portion of an ATI to extend beyond a footprint of the socket 110. For example, the gap 510 may enable an ATI extension 630 (FIG. 6) to extend beyond a footprint of the socket 110 in order to contact pogo pins 115 (FIG. 1).

Figure 6:
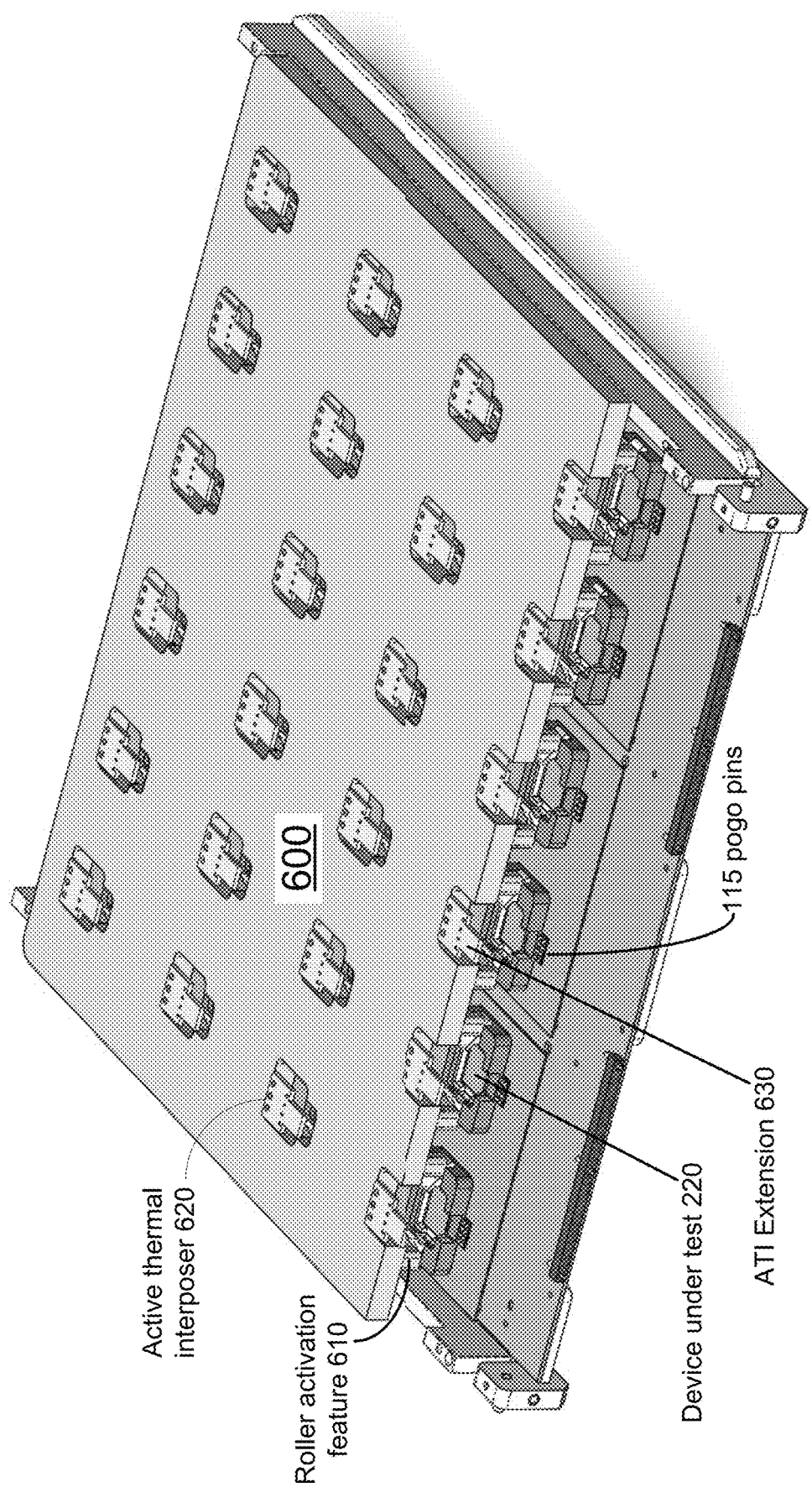
FIG. 6 illustrates an exemplary interaction of an active thermal interposer placement plate with a test interface board assembly, in accordance with embodiments of the present invention.

FIG. 6 illustrates an exemplary interaction of an active thermal interposer (ATI) placement plate 600 with a test interface board assembly 100, in accordance with embodiments of the present invention. Active thermal interposer (ATI) placement plate 600 comprises a plurality of roller activation features 610. The roller activation features 610 are similar to the roller activation features 210 of FIG. 2, and are configured to apply a force to the spring-loaded roller retention devices 120 (FIG. 1) to open the spring-loaded roller retention devices 120 such than an active thermal interposer device 620 may be placed onto the device under test 220 and into the socket 110 (FIG. 1). In accordance with embodiments of the present invention, an ATI device 620 may comprise a ceramic based heater, a cartridge heater, a film heater, a thermoelectric cooler (TEC)/Peltier device, a combination of a TEC with ceramic heater, cartridge heater or film heater, and/or a combination of any of the above plus a metal interposer/heat sink that takes the shape of the device under test (DUT). Further information on, and exemplary embodiments of active thermal interposers may be found in U.S. patent application Ser. No. 17/531,649, entitled "Testing System Including Active Thermal Interposer Device," which is incorporated herein by reference in its entirety.

Placement of the active thermal interposer(s) 620 may be performed in a similar manner and with similar systems as disclosed for placement of device(s) under test 220, for example, as described in FIGS. 3 and 4, in accordance with embodiments of the present invention. For example, loader 410 (FIG. 4), or a similar apparatus, may be used to populate active thermal interposers into sockets 110. ATI placement plate 600 may be identical to and/or the same as Z-axis interface (ZIF) plate 200 (FIG. 2), in some embodiments.

In some embodiments, placement of ATIs 620 into the sockets 110 may not require a use of pick and place heads. Rather, a plurality of ATIs 620 may be moved into place over the sockets 110 by ATI placement plate 600. The active thermal interposers (ATI) 620 may be held in the active thermal interposer placement plate 600 in a variety of manners, in accordance with embodiments of the present invention. For example, the active thermal interposers 620 may be pulled using vacuum pads and retained using vacuum. For example, the top surface of the active thermal interposers 620 may have metal discs that correspond to magnets, e.g., controllable electromagnets, of the active thermal interposer placement plate 600. In some embodiments, the active thermal interposer 620 assembly may comprise holes for push pins of the active thermal interposer placement plate 600. The pins may be configured to selectively grab and release the active thermal interposer 620.

When the holding mechanism is disengaged, the ATIs 620 are placed into and/or allowed to fall into the sockets 110.

Figure 7:
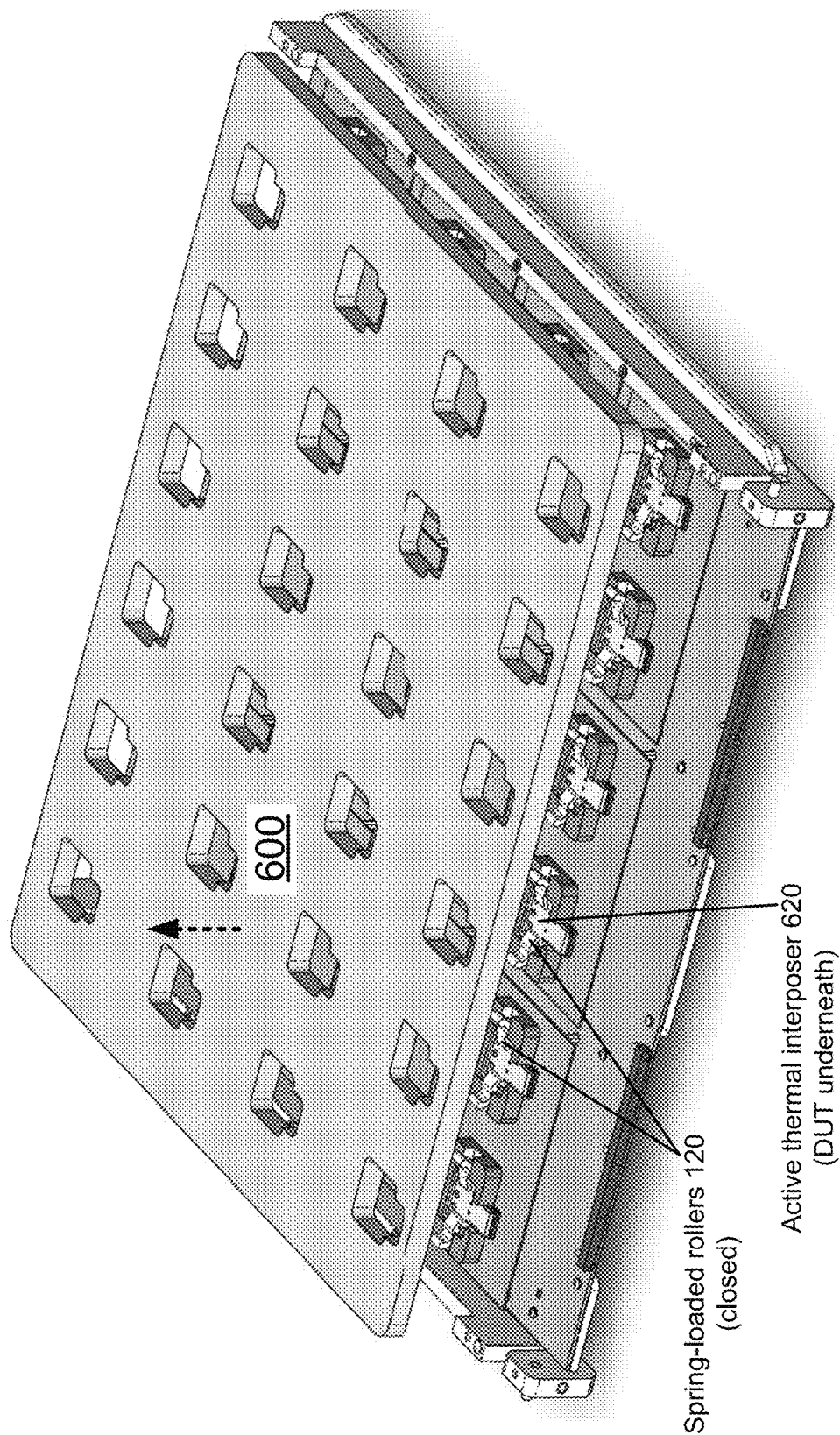
FIG. 7 illustrates an exemplary active thermal interposer placement plate raised above a test interface board assembly subsequent to placement of an active thermal interposer onto a device under test, in accordance with embodiments of the present invention.

FIG. 7 illustrates an exemplary active thermal interposer (ATI) placement plate 600 raised above a test interface board assembly 100 subsequent to placement of an active thermal interposer (ATI) 620 onto a device under test (DUT) 220, in accordance with embodiments of the present invention. Upon lifting of the ATI placement plate and the associated roller activation features 610, the stack of an ATI 620 and a DUT 220 is captured in socket 110 by the spring-loaded roller retention devices 120, in a closed position.

Figure 8:
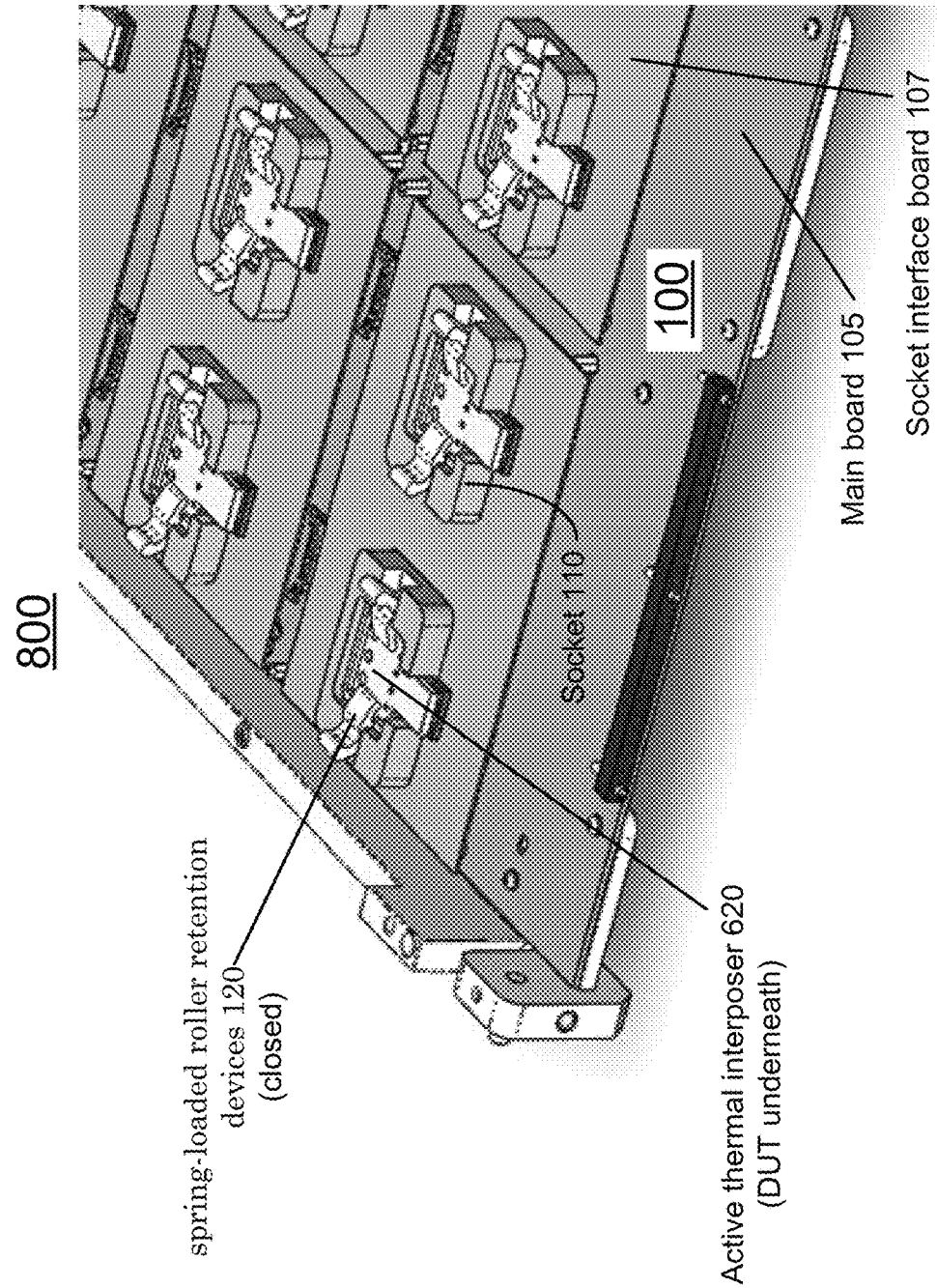
FIG. 8 illustrates an exemplary partial view of configuration of a test interface board assembly populated with a plurality of devices under test, and active thermal interposers, in accordance with embodiments of the present invention.

FIG. 8 illustrates an exemplary partial view of configuration 800 of a test interface board assembly 100 populated with a plurality of devices under test (DUT) 220 (obscured in this view), and active thermal interposers (ATI) 620, in accordance with embodiments of the present invention. The spring-loaded roller retention devices 120 are closed onto the stack of DUT 220 and ATI 620, retaining them in the sockets 110. The populated test interface board assembly 800 is configured for loading into a tester slot.

Figure 9:
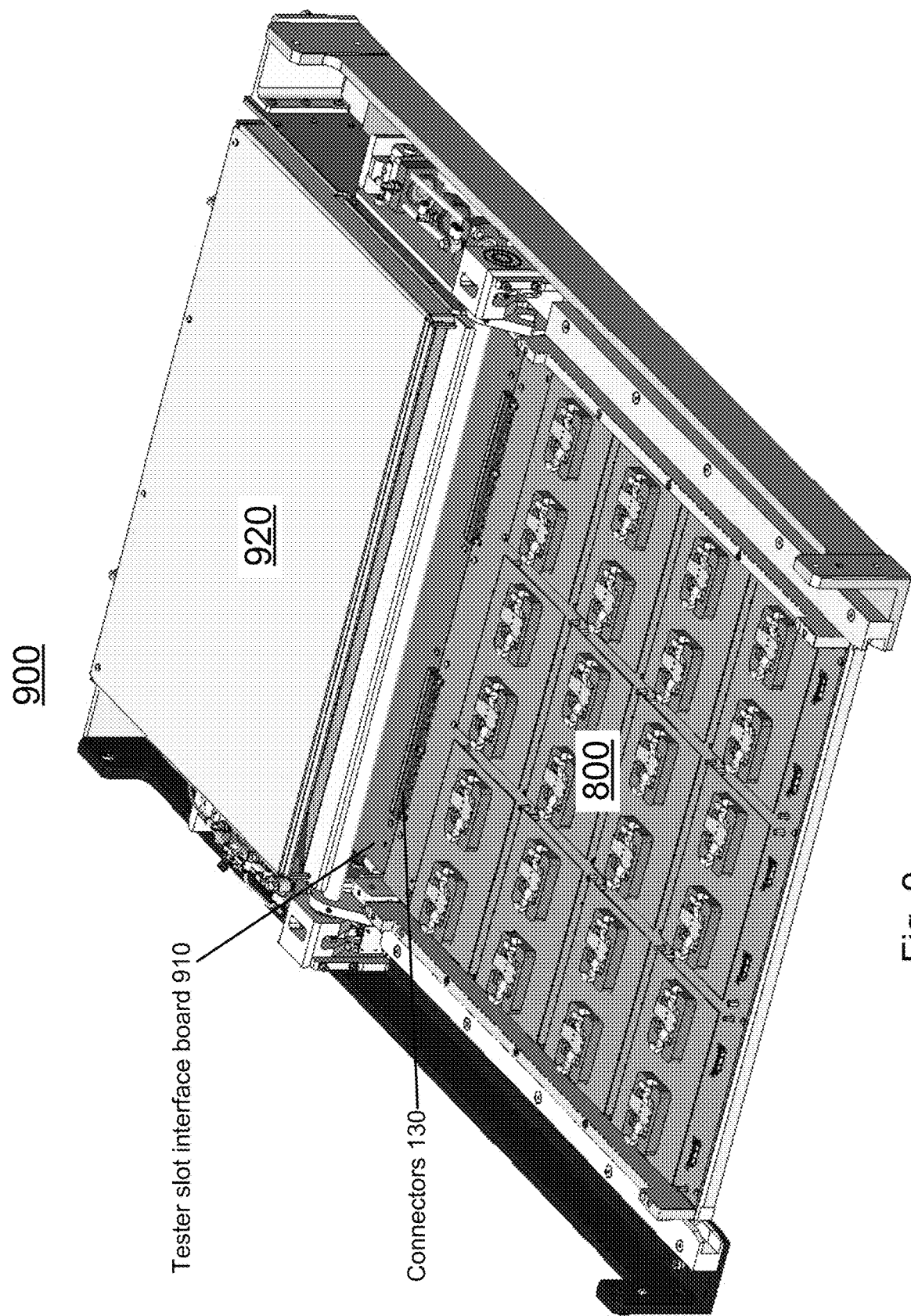
FIG. 9 illustrates an exemplary tester slot apparatus, in accordance with embodiments of the present invention.

FIG. 9 illustrates an exemplary tester slot apparatus 900, in accordance with embodiments of the present invention. Tester slot apparatus 900 is configured to be placed into a multi-slot test system. Tester slot apparatus 900 comprises a populated test interface board assembly 800, and tester slot interface board 910. The connector(s) 130 of testing interface board assembly 800 couple to corresponding connectors on the tester slot interface board 910. Tester slot apparatus 900 further comprises a power delivery board 920 configured to supply electrical power to the DUTs 220 (FIG. 5) and/or ATIs 620 (FIG. 6) of populated test interface board assembly 800. The tester slot apparatus 900 is configured for loading into a multi-slot test system.

Figure 10:
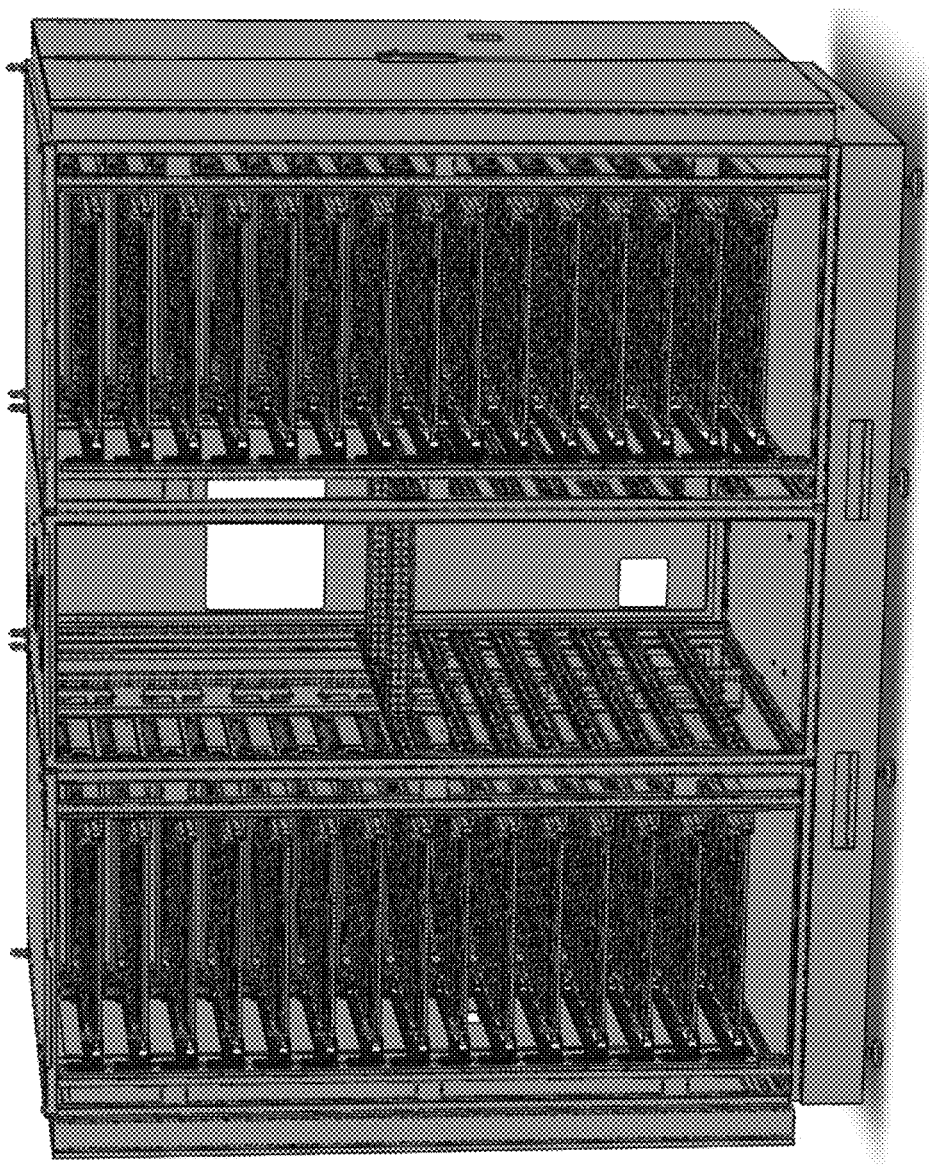
FIG. 10 illustrates an exemplary multi-slot test system, in accordance with embodiments of the present invention.

FIG. 10 illustrates an exemplary multi-slot test system 1000, in accordance with embodiments of the present invention. Multi-slot test system 1000 is configured to accept a plurality, e.g., 30, of tester slot apparatus 900 units, and test the tester slot units. As illustrated in FIG. 10, 30 tester slot apparatus 900 units are loaded into multi-slot test system 1000. Testing by the multi-slot test system 1000 of the tester slot apparatus 900 units may be performed in parallel or sequentially, in some embodiments. Multi-slot test system 1000 may comprise or be coupled to a test computer system, for example, electronic system 1200 of FIG. 12, further described below. Multi-slot test system 1000 generally provides test signals, control signals, and electrical power to the plurality of DUTs 220 (FIG. 3) and/or ATIs 620 (FIG. 6), and collects test results. Multi-slot test system 1000 may also provide non-electrical resources to the tester slots 900, for example, cooling fluids, in some embodiments.

The active thermal interposer 620 may comprise an ATI extension 630 configured to couple to pogo pins (or contacts) 115, in accordance with embodiments of the present invention. Generally, the pogo pins may be provided on the test interface board 110, e.g., on a socket interface board 107. However, in some embodiments, the test interface board 110 may comprise pogo pin contacts while the active thermal interposer assembly comprises pogo pins. The pogo pins 115 may provide for signals and/or power couplings for an active thermal interposer, for example.

After placement of the active thermal interposers 620 into the sockets 110 (on "top" of the devices under test 220), the active thermal interposer (ATI) placement plate 600 may be raised such that the roller activation features 610 no longer contact, e.g., push "down" on, the spring-loaded roller retention devices 120. Due to the spring activation features of the spring-loaded roller retention devices 120, the spring-loaded roller retention devices 120 will close onto the active thermal interposer (ATI) 620, securing the DUTs 220 and ATIs 620 into the sockets 110.

Figure 11:
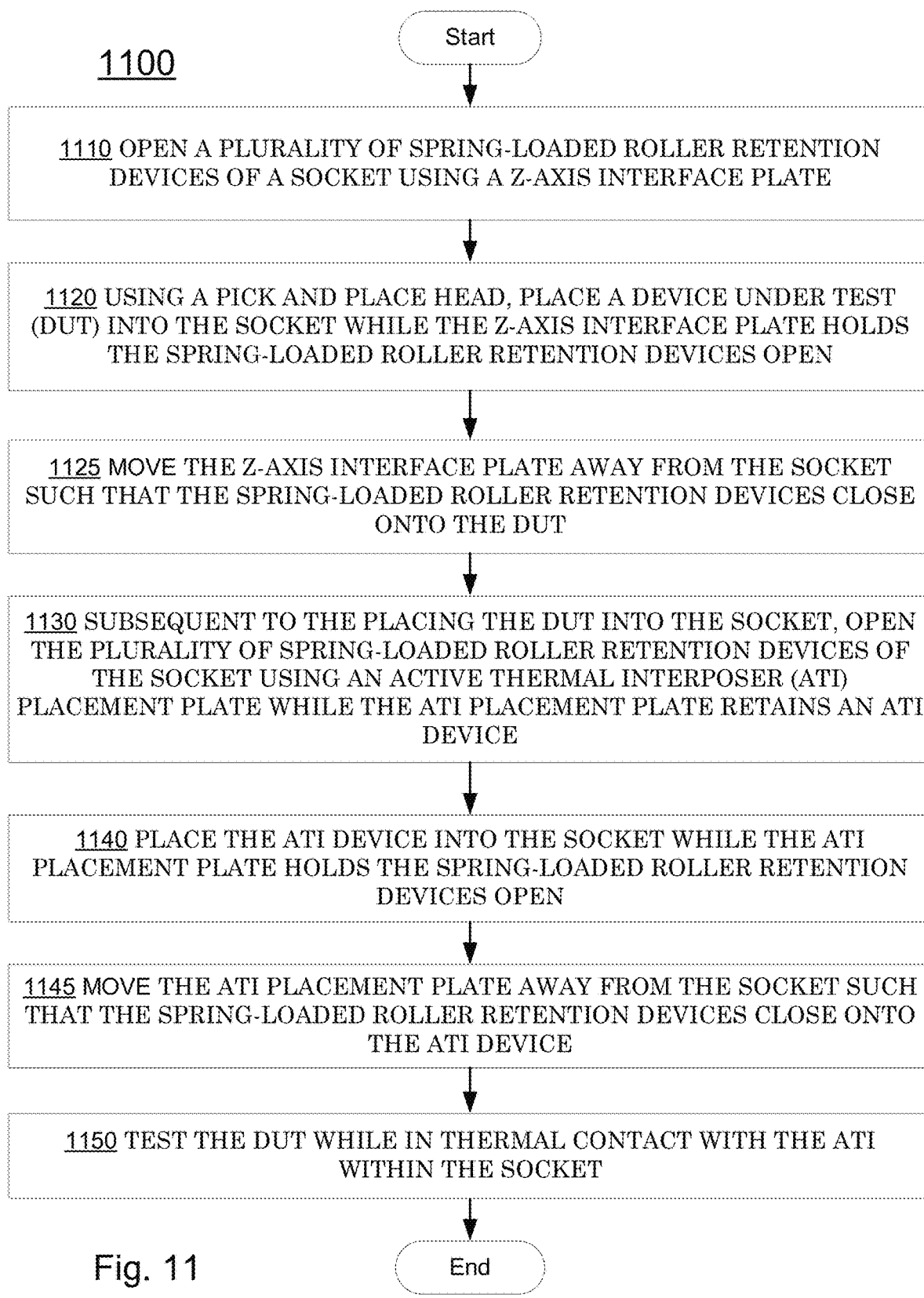
FIG. 11 illustrates an exemplary computer-controlled method of testing a device under test, in accordance with embodiments of the present invention.

FIG. 11 illustrates an exemplary computer-controlled method 1100 of testing a device under test, in accordance with embodiments of the present invention. The device under test may be device under test 220, as described in FIG. 2, in some embodiments. In 1110, a plurality of spring-loaded roller retention devices, e.g., spring-loaded roller retention devices 120 (FIG. 1) of a socket using a Z-axis interface plate, for example, Z-axis interface plate 200, as described with relation to FIG. 2. In 1120, using a pick and place head, a device under test (DUT) is automatically placed into the socket while the Z-axis interface plate holds the spring-loaded roller retention devices open.

In optional 1125, the Z-axis interface plate is automatically moved away from the socket such that the spring-loaded roller retention devices close onto the DUT. In 1130, subsequent to the placing the DUT into the socket, the plurality of spring-loaded roller retention devices of the socket are opened using an active thermal interposer (ATI) placement plate, wherein the ATI placement plate retains an ATI device. In 1140, the ATI device is automatically placed into the socket while the ATI placement plate holds the spring-loaded roller retention devices open. In optional 1145, the ATI placement plate is automatically moved away from the socket such that the spring-loaded roller retention devices close onto the ATI device. In 1150, the DUT is tested while in thermal contact with the ATI within the socket.

Figure 12:
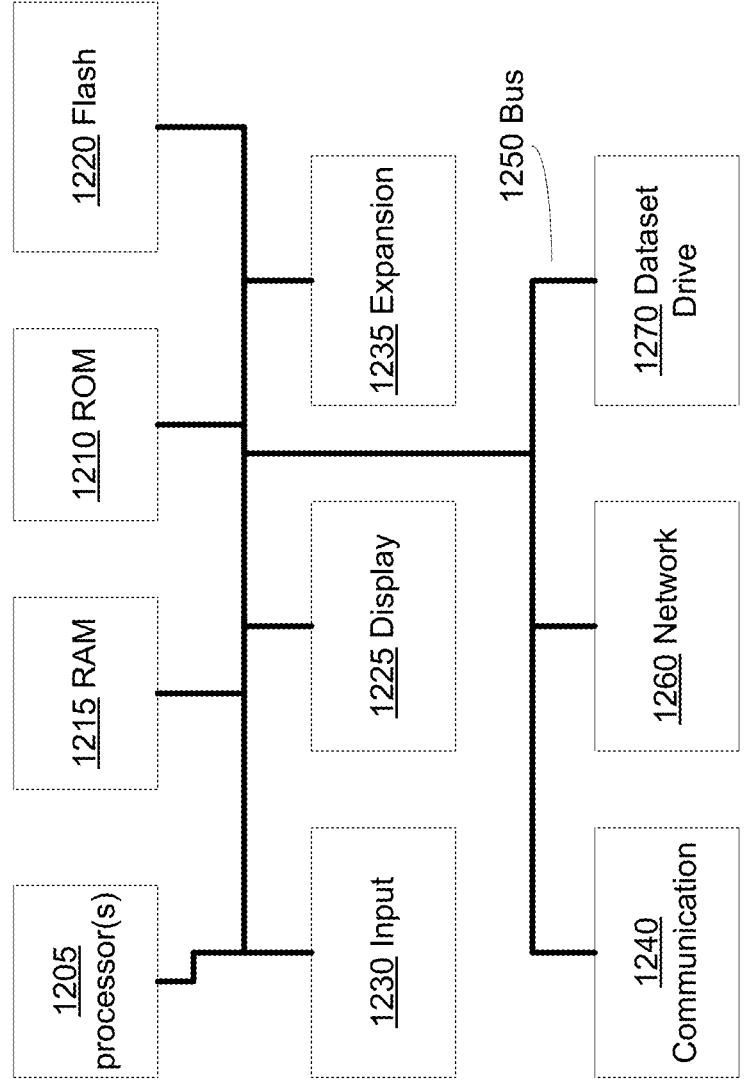
FIG. 12 illustrates a block diagram of an exemplary electronic system, which may be used as a platform to implement and/or as a control system for an automated test equipment, in accordance with embodiments of the present invention.

FIG. 12 illustrates a block diagram of an exemplary electronic system 1200, which may be used as a computer system platform to implement and/or as a control system for an automated test equipment, e.g., multi-slot test system 1000 (FIG. 10), in accordance with embodiments of the present invention. Electronic system 1200 may be a "server" computer system, in some embodiments. Electronic system 1200 includes an address/data bus 1250 for communicating information, a central processor complex 1205 functionally coupled with the bus for processing information and instructions. Bus 1250 may comprise, for example, a Peripheral Component Interconnect Express (PCIe) computer expansion bus, industry standard architecture (ISA), extended ISA (EISA), MicroChannel, Multibus, IEEE 796, IEEE 1296, IEEE 1496, PCI, Computer Automated Measurement and Control (CAMAC), MBus, Runway bus, Compute Express Link (CXL), and the like.

Central processor complex 1205 may comprise a single processor or multiple processors, e.g., a multi-core processor, or multiple separate processors, in some embodiments. Central processor complex 1205 may comprise various types of well-known processors in any combination, including, for example, digital signal processors (DSP), graphics processors (GPU), complex instruction set (CISC) processors, reduced instruction set (RISC) processors, and/or very long word instruction set (VLIW) processors. In some embodiments, exemplary central processor complex 1205 may comprise a finite state machine, for example, realized in one or more field programmable gate array(s) (FPGA), which may operate in conjunction with and/or replace other types of processors to control embodiments in accordance with the present invention.

Electronic system 1200 may also include a volatile memory 1215 (e.g., random access memory RAM) coupled with the bus 1250 for storing information and instructions for the central processor complex 1205, and a non-volatile memory 1210 (e.g., read only memory ROM) coupled with the bus 1250 for storing static information and instructions for the processor complex 1205. Electronic system 1200 also optionally includes a changeable, non-volatile memory 1220 (e.g., NOR flash) for storing information and instructions for the central processor complex 1205 which can be updated after the manufacture of system 1200. In some embodiments, only one of ROM 1210 or Flash 1220 may be present.

Also included in electronic system 1200 of FIG. 12 is an optional input device 1230. Device 1230 can communicate information and command selections to the central processor 1200. Input device 1230 may be any suitable device for communicating information and/or commands to the electronic system 1200. For example, input device 1230 may take the form of a keyboard, buttons, a joystick, a track ball, an audio transducer, e.g., a microphone, a touch sensitive digitizer panel, eyeball scanner, and/or the like.

Electronic system 1200 may comprise a display unit 1225. Display unit 1225 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 1225 may have an associated lighting device, in some embodiments.

Electronic system 1200 also optionally includes an expansion interface 1235 coupled with the bus 1250. Expansion interface 1235 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 1394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 1235 may comprise signals substantially compliant with the signals of bus 1250.

A wide variety of well-known devices may be attached to electronic system 1200 via the bus 1250 and/or expansion interface 1235. Examples of such devices include without limitation rotating magnetic memory devices, flash memory devices, digital cameras, wireless communication modules, digital audio players, and Global Positioning System (GPS) devices.

System 1200 also optionally includes a communication port 1240. Communication port 1240 may be implemented as part of expansion interface 1235. When implemented as a separate interface, communication port 1240 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 1394, and synchronous ports.

System 1200 optionally includes a network interface 1260, which may implement a wired or wireless network interface. Electronic system 1200 may comprise additional software and/or hardware features (not shown) in some embodiments.

Various modules of system 1200 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Figure 13:
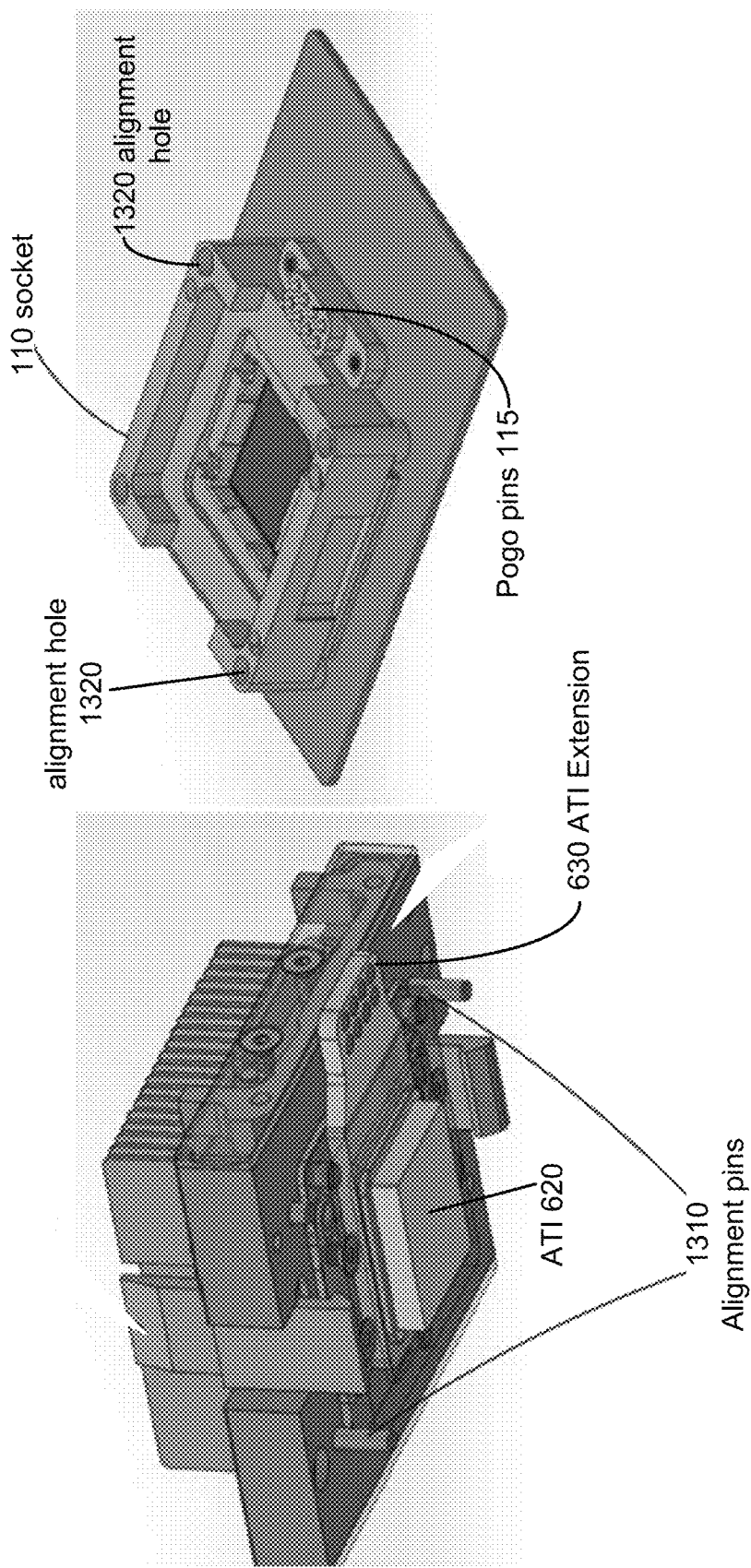
FIG. 13 illustrates an exemplary alignment system for ATI insertion into a socket, in accordance with embodiments of the present invention.

FIG. 13 illustrates an exemplary alignment system for ATI insertion into a socket, in accordance with embodiments of the present invention. Active thermal interposer device 620 comprises a plurality of alignment pins 1310 configured for insertion into corresponding alignment holes of a socket, e.g., socket 110. The alignment pins 1310 may comprise any suitable material, including, for example, thermoplastic and/ or metal. The alignment pins 1310 may comprise a draft or taper to provide compliance to correct misalignment, in some embodiments. The socket 110 may comprise a plurality of alignment holes 1320 configured to accept alignment pins 1310. The alignment holes 1320 may comprise a draft or taper to provide compliance to correct misalignment, in some embodiments.

In some embodiments, every individual socket 110 may have its own alignment features. Each individual ATI has its own alignment pins so the alignment of an ATI to each socket occurs independently and individually. However, the insertion and alignment of all ATIs into the the sockets on a test interface board assembly, e.g., TIB 100, occur substantially simultaneously.

Embodiments in accordance with the present invention provide systems and methods for parallel test cells with self actuated sockets. In addition, embodiments in accordance with the present invention provide systems and methods for parallel test cells with self actuated sockets that open and close socket retention mechanisms in parallel. Further, embodiments in accordance with the present invention provide systems and methods for parallel test cells with self actuated sockets that place active thermal interposer devices in parallel. Still further, embodiments in accordance with the present invention provide systems and methods for parallel test cells with self actuated sockets that are compatible and complementary with existing systems and method of electronic device testing.

Although the invention has been shown and described with respect to a certain exemplary embodiment or embodiments, equivalent alterations and modifications will occur to others skilled in the art upon the reading and understanding of this specification and the annexed drawings. In particular regard to the various functions performed by the above described components (assemblies, devices, etc.) the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

Various embodiments of the invention are thus described. While the present invention has been described in particular embodiments, it should be appreciated that the invention should not be construed as limited by such embodiments, but rather construed according to the below claims

What is claimed is:

1. An automated test equipment (ATE) for testing devices under test (DUTs), the ATE comprising:

a test interface board assembly comprising:

a socket configured to provide electrical couplings from said test interface board assembly to a device under test (DUT), wherein said socket is further configured to accept an active thermal interposer (ATI) device while said DUT is contemporaneously disposed in said socket, and wherein said socket comprises a plurality of spring-loaded roller retention devices configured to retain one or more devices in said socket;

a Z-axis interface plate configured to open said plurality of spring-loaded roller retention devices to enable insertion of said DUT into said socket; and an ATI placement plate configured to open said plurality of spring-loaded roller retention devices to enable insertion of said ATI device into said socket.

2. The automated test equipment of claim 1 wherein said ATI placement plate is further configured to place said ATI device above said socket.

3. The automated test equipment of claim 1 wherein said ATI placement plate is further configured to place a plurality of ATI devices above a corresponding plurality of said sockets.

4. The automated test equipment of claim 1 wherein said Z-axis interface plate comprises a plurality of roller activation features configured to open said plurality of spring-loaded roller retention devices.

5. The automated test equipment of claim 1 wherein said Z-axis interface plate comprises a plurality of holes configured to allow a pick and place head to place said DUT into said socket while said plurality of spring-loaded roller retention devices are contemporaneously held open by said Z-axis interface plate.

6. The automated test equipment of claim 1 wherein said ATI placement plate comprises a plurality of roller activation features configured to open said plurality of spring-loaded roller retention devices.

7. The automated test equipment of claim 1 wherein said ATI placement plate is configured to allow said ATI device to be placed into said socket while said plurality of spring-loaded roller retention devices are contemporaneously held open by said ATI placement plate.

8. The automated test equipment of claim 1 wherein said Z-axis interface plate is configured for movement along an axis perpendicular to a plane of said test interface board assembly to open and close said plurality of spring-loaded roller retention devices.

9. The automated test equipment of claim 1 wherein said ATI placement plate is configured for movement along an axis perpendicular to a plane of said test interface board assembly to open and close said plurality of spring-loaded roller retention devices.

10. The automated test equipment of claim 1 wherein said Z-axis interface plate is configured to open said plurality of spring-loaded roller retention devices of at least two sockets.

11. The automated test equipment of claim 1 wherein said ATI placement plate is configured to open said plurality of spring-loaded roller retention devices of at least two sockets.

12. The automated test equipment of claim 1 further comprising a plurality of pogo pins configured to provide electrical power among said test interface board assembly and said ATI independent of electrical contacts of said socket.

13. The automated test equipment of claim 1 wherein said socket is physically and electrically coupled to a socket interface board, and wherein said socket interface board is physically and electrically coupled to a main board of said test interface board assembly.

14. The automated test equipment of claim 1 wherein said socket comprises a gap in at least one side thereof configured to enable a portion of an ATI to extend beyond a footprint of said socket.

15. An automated test equipment comprising:
   a test interface board assembly comprising a plurality of socket interface boards, wherein each socket interface board comprises:
   a socket configured to restrain a device under test (DUT), wherein
   the socket is further configured to restrain a discrete active thermal interposer (ATI), and
   wherein the ATI comprises thermal functionality and is operable to make thermal contact with the DUT;
   an ATI placement plate configured to contain the ATI prior to placement in the socket, wherein
   the ATI is separate of the ATI placement plate, and wherein
   the ATI placement plate is further configured to provide a contact force sufficient to open retention features of said socket.

16. The automated test equipment of claim 15 wherein the ATI placement plate is further configured to open said retention features of all sockets on said plurality of socket interface boards in a single operation.

17. The automated test equipment of claim 15 wherein the retention features of said socket comprise a spring-loaded roller retention device.

18. The automated test equipment of claim 15 wherein the thermal functionality of said ATI comprise cooling said DUT.

19. A method of testing a device under test, said method comprising:
   opening a plurality of spring-loaded roller retention devices of a socket using a Z-axis interface plate;
   using a pick and place head, placing a device under test (DUT) into the socket while the Z-axis interface plate contemporaneously retains the spring-loaded roller retention devices in an open state;
   subsequent to said placing said DUT into the socket, opening the plurality of spring-loaded roller retention devices of said socket using an active thermal interposer (ATI) placement plate, wherein said ATI placement plate retains an ATI device;
   placing said ATI device into said socket while the ATI placement plate contemporaneously retains the spring-loaded roller retention devices in an open state; and
   testing said DUT while in thermal contact with said ATI within said socket.

20. The method of claim 19 further comprising automatically closing the plurality of spring loaded roller retention devices responsive to the ATI placement plate moving away from the socket.

* * * * *